US006353401B1

(12) United States Patent
Aswell et al.

(10) Patent No.: US 6,353,401 B1
(45) Date of Patent: Mar. 5, 2002

(54) OPTICAL SENSOR ARRAY WITH ZONE-PROGRAMMABLE GAIN AND OFFSET

(75) Inventors: Cecil J. Aswell, Orangevale, CA (US); Eugene G. Dierschke, Dallas; John Hull Berlien, Jr., Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/333,850

(22) Filed: Jun. 15, 1999

Related U.S. Application Data (60) Provisional application No. 60/089,231, filed on Jun. 15, 1998.

(51) Int. Cl.⁷ ............................................. H03M 1/06
(52) U.S. Cl. ........................ 341/118; 341/120; 341/139
(58) Field of Search ............................... 341/118, 120, 341/139

(56) References Cited

U.S. PATENT DOCUMENTS 4,771,267 A * 9/1988 Russell, Jr. et al. ......... 341/118
5,811,808 A * 9/1998 Cannata et al. ............. 250/332

* cited by examiner

Primary Examiner—Michael Tokar
Assistant Examiner—Anh Tran
(74) Attorney, Agent, or Firm—J. Dennis Moore; W. James Brady, III; Frederick J. Telecky, Jr.

(57) ABSTRACT

An optical sensor array with zone-programmable gain and offset prior to A/D conversion for reducing quantization noise. The circuit comprises a register file which contains digital words for controlling gain and offset according to multi-pixel zones.

32 Claims, 8 Drawing Sheets

OPTICAL SENSOR ARRAY WITH ZONE-PROGRAMMABLE GAIN AND OFFSET

This application claims benefit to Provisional Application 60/089,231 filed Jun. 15, 1998.

BACKGROUND AND SUMMARY OF THE INVENTION

The present invention relates to integrated imaging sensor circuits.

1. Background Converter Calibration

Optical arrays for scanning or imaging applications are subject to variations in response due to non-uniform external optics and illumination. In order to prevent clipping of signals during analog-to-digital conversion, the full scale of the analog-to-digital converter ("ADC") must be greater than the maximum output of the most responsive pixel in the array. (This is usually set by controlling light intensity and/or light integration periods.) However, since there can be a substantial variation in responsivity between the most responsive pixels and the least responsive pixels of the array, the less responsive pixels will have lower dynamic range and higher quantization noise than the more responsive pixels. Other prior-art solutions use a higher precision external ADC, and other digital techniques to restore the dynamic range. The problem is exacerbated by stray background light which raises the dark level (lower limit) of the pixel output, further reducing dynamic range and increasing quantization noise.

Another source of difficulty is the fall-off in brightness at the edge of a lensed image. Any lens of a given focal length and f-number will have uniform brightness only over a limited image radius, and other parts will be less bright. In many applications this is not critical, but it is still a significant effect.

2. Optical Sensor Array With Zone-Programmable Gain and Offset

The present application discloses a technique where gain and offset of particular pixel zones may be programmed prior to analog-to-digital conversion. Since the variations in responsivity due to external optics and illumination vary gradually as a function of geometry, the problem of reduced dynamic range and increased quantization noise can be substantially reduced by programming the respective gain and offset of groups of adjacent pixels. In this way, the dark and white levels of the groups (zones) correspond closely to the zero and full scale of the analog-to-digital converter ("ADC") being used to convert the pixel signals. Thus, the converter input is closely matched to the dynamic range of the pixel outputs. The innovative circuit comprises a control circuit capable of addressing all pixel zones. A register file contains digital words for controlling a programmable gain amplifier and an offset digital-to-analog converter ("DAC"). The offset DAC generates an offset voltage in response to a command from the register file. The offset voltage is then summed with a serial analog output of the pixel array. The output of the programmable amplifier is then digitized and sent to an I/O interface circuit for access to external circuits. In one class of embodiments the zone-programmable gain and offset parameters are adjusted dynamically, so that the sensing parameters can be optimized with respect to overall scene brightness as the viewed scene changes.

A principal advantage is that when adjusting less responsive pixels prior to conversion, quantization noise becomes less of a concern, and less down-stream signal processing is required than in prior-art designs. Various of these innovations also reduce quantization noise in pixels with lower response characteristics.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Zone-Programmable Gain and Offset Circuit

Figure 1:
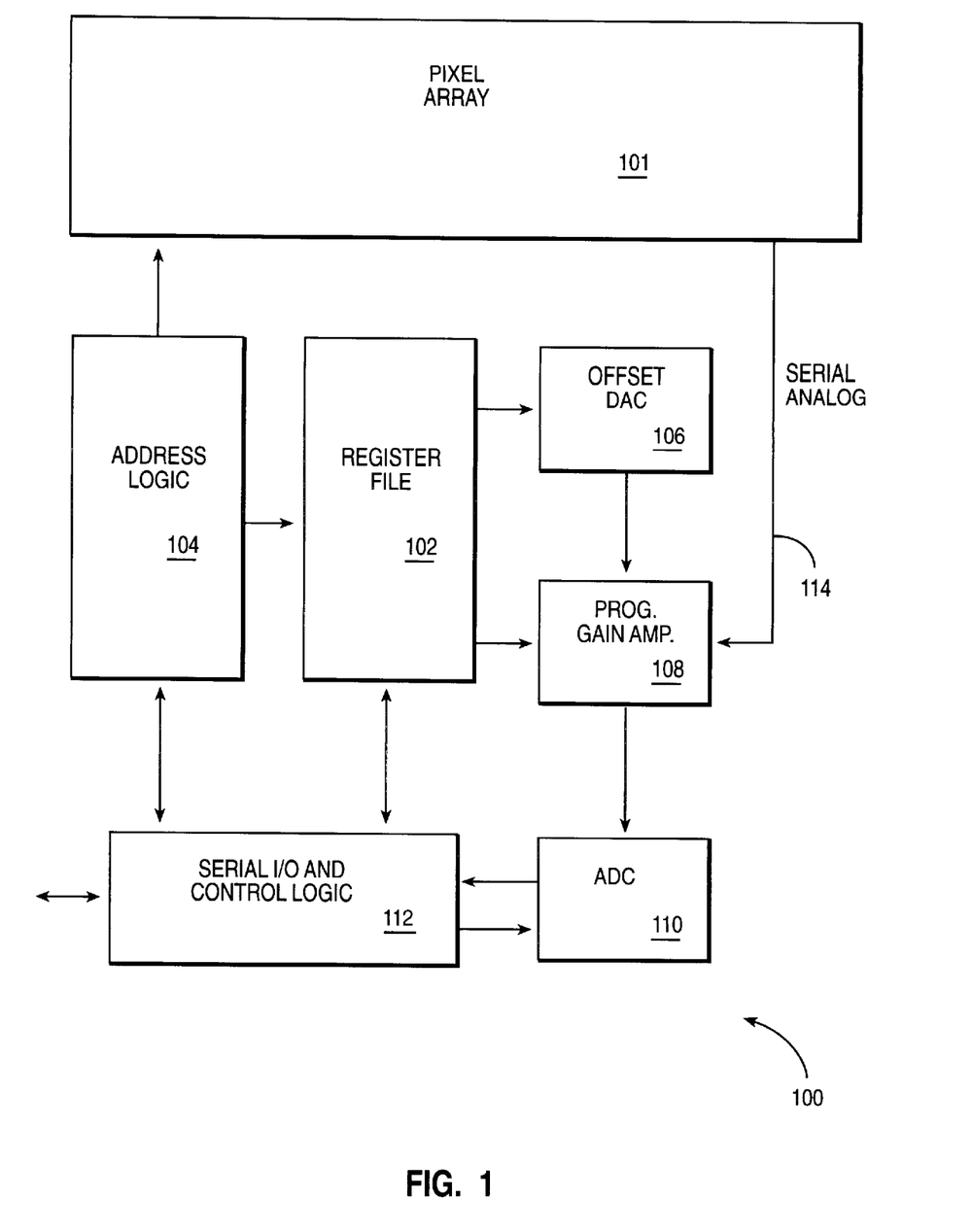
FIG. 1 shows a circuit block diagram of a preferred embodiment of the programmable gain and offset circuit.

FIG. 1 is a simplified block diagram of a preferred embodiment of a sensor array chip comprising the zone programmable gain and offset circuit. In a first innovative embodiment, the sensor array chip 100 comprises a pixel array 101, an ADC 110, and additional addressing, control, and interface circuits. In this embodiment, to further enhance the cost effectiveness of any array, the programmable gain and offset functions (108 and 106, respectively), and the ADC 110 are manufactured on the array chip, and therefore can be controlled by a simple serial digital I/O circuit.

The pixel array 101, in the presently preferred embodiment, comprises an array of identical photodiodes and associated integrator/amplifiers (of e.g. CMOS device structures) with a serial analog output. The address logic 104 connects to the pixel array 101, and controls which pixels are being accessed and which corresponding registers in the register file 102 are being addressed. The register file 102 consists of a number of pairs of registers for controlling the programmable gain amplifier 108 and the offset DAC 106. Each pair of registers in the register file 102 corresponds to a physically adjacent set (or zone) of pixels. The serial analog output 114 from the array 101 is connected to the input of a programmable gain amplifier 108 whose gain is controlled by a digital word from the register file 102. The offset DAC 106, which is controlled by another word from the register file 102, generates an offset signal which ultimately gets added to the signal in the integrating capacitor of the programmable gain amplifier 108. This offset signal is summed with the serial analog output 114 from the pixel array 101. The resultant voltage at the output of the programmable gain amplifier is converted to a digital value by the ADC 110. The serial I/O and control logic 112 interprets commands and data to and from the external world. It is used to load values into the register file 102, to initiate a scan sequence, to control the ADC 110, and to transmit the ADC 110 output values to the external circuitry. Prior to scanning an image, the system is calibrated by imaging a "white" target (full-scale value) and a "black" value (zero value) with the gain and offset registers of the register file 102 set to nominal values. The resulting output is normalized by external control circuitry and new values are read into the register control file 102. Consequently, the minimum gain scaled and offset values at the programmable gain amplifier 108 output are near zero for black signals and near the full-scale value of the ADC for white signals. Thus the zero and full-scale readings from the ADC 110 correspond to black and white images, respectively, regardless of variations in optics and illumination. The number of zones corrected is arbitrary. In the extreme case, there may be one pixel per zone. Typically, there are many pixels per zone (e.g. 34 pixels per zone). As noted above, the primary reason for the programmable gain and offset prior to analog-to-digital conversion is to reduce the quantization noise that would result if the gain scaling were performed digitally after the conversion.

Figure 4A:
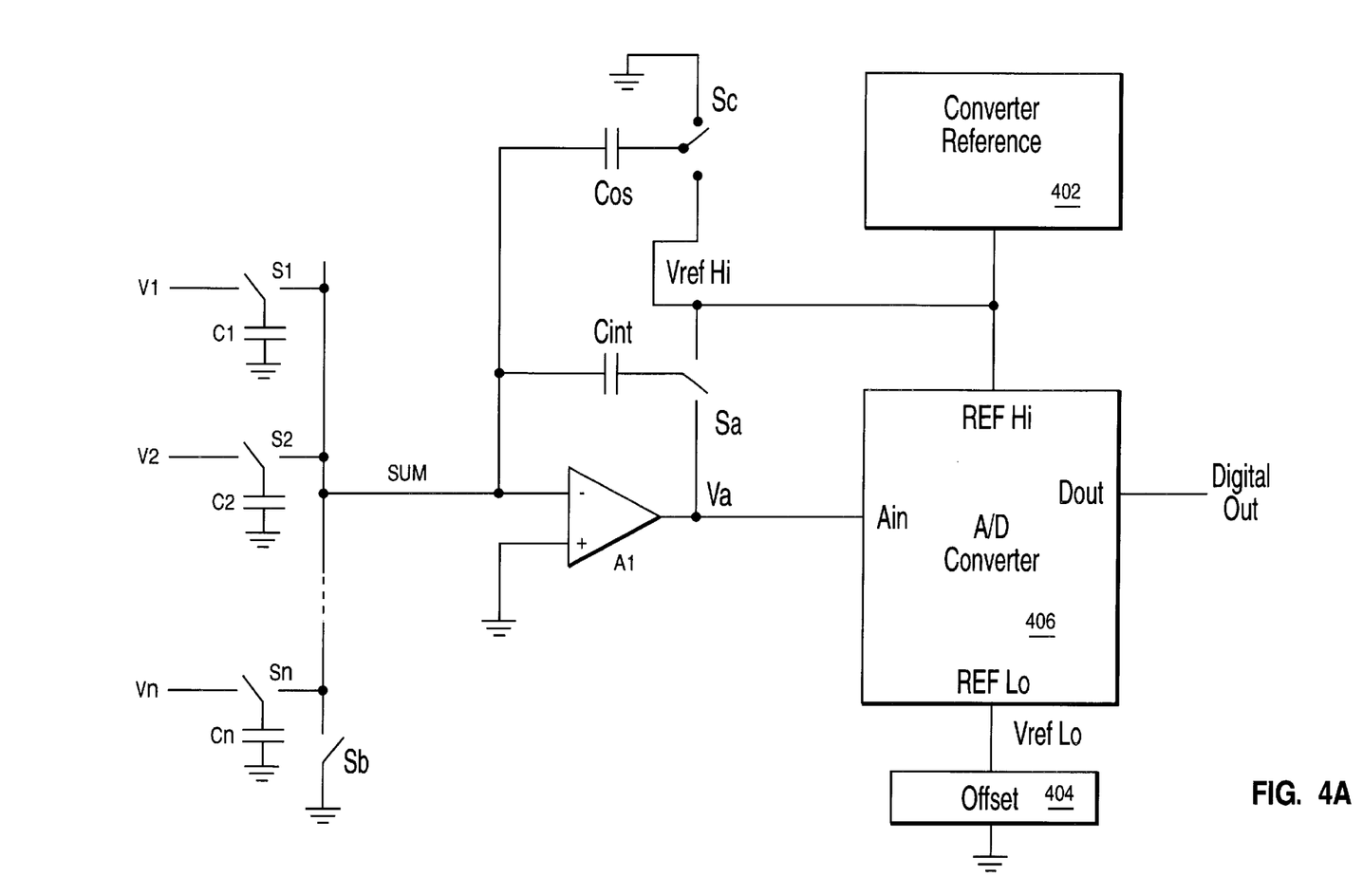
FIG. 4A shows a more detailed diagram of the preferred embodiment.

FIG. 4A is a more detailed diagram of the offset DAC, programmable gain amplifier, and ADC, as shown in FIG. 1. Input voltages V1, V2 . . . Vn are the outputs of pixel integrators fixed in an array 101. (Linear arrays may have hundreds of pixels; area arrays may have 10K to 10M pixels.) Capacitors C1, C2, . . . Cn are sampling capacitors. Amplifying element A1 is a high gain, high speed operational amplifier with a switched integrator feedback capacitor Cint. The converter reference 402 is a stable voltage reference source (e.g. a bandgap reference). The offset reference circuitry 404 represents a voltage source that is a fixed fraction of the converter reference voltage 402. (Making the offset 404 proportional to the reference 402 assures that the offset is controlled and tracks the reference voltage.) The ADC 406 digitizes the voltage Va present at ADC input Ain, with a zero code representing Va equal to VrefLo, and a full scale code representing Va input equal to VrefHi. (Note that a simple one's complement (all bits inverted) reverses the sense of the converter. That is, a zero code can be generated with an input of VrefHi, and a full scale output can be generated with an input of VrefLo.) In operation, voltages V1, V2 . . . Vn are typically simultaneously sampled on the corresponding capacitors C1, C2 . . . Cn through switches S1, S2, . . . Sn. To start a conversion cycle, switch Sa is put in the upper position, switch Sc is put in the lower position to contact VrefHi, and switch Sb is closed. This precharges capacitor Cint and capacitor Cos to VrefHi. Next, switch Sb is then opened, switch Sa is switched to the lower position to contact Va, switch Sc is switched to the upper position to contact ground, and concurrently switch S1 is connected to the SUM node. Assuming non-overlapping switches, the voltage Va on the output of amplifying element A1 will settle to the voltage Va=VrefHi−(V1*C1−Cos*VRefHi)/Cint. (By reversing the polarity of switch Sc, the opposite polarity can be achieved.) Voltage Va is then converted by the ADC, and the digital representation of Va is present at the digital output Dout. Both Cint and Cos are programmable capacitor DACs controlled by the gain and offset registers. If V1 includes a dark level offset due to the pixel electronics, this dark level offset can be cancelled with the Cos DAC. Then only the part of the V1 signal due to light response will be inputted into the ADC 406.

TSL2301 Product Implementation

Figure 3:
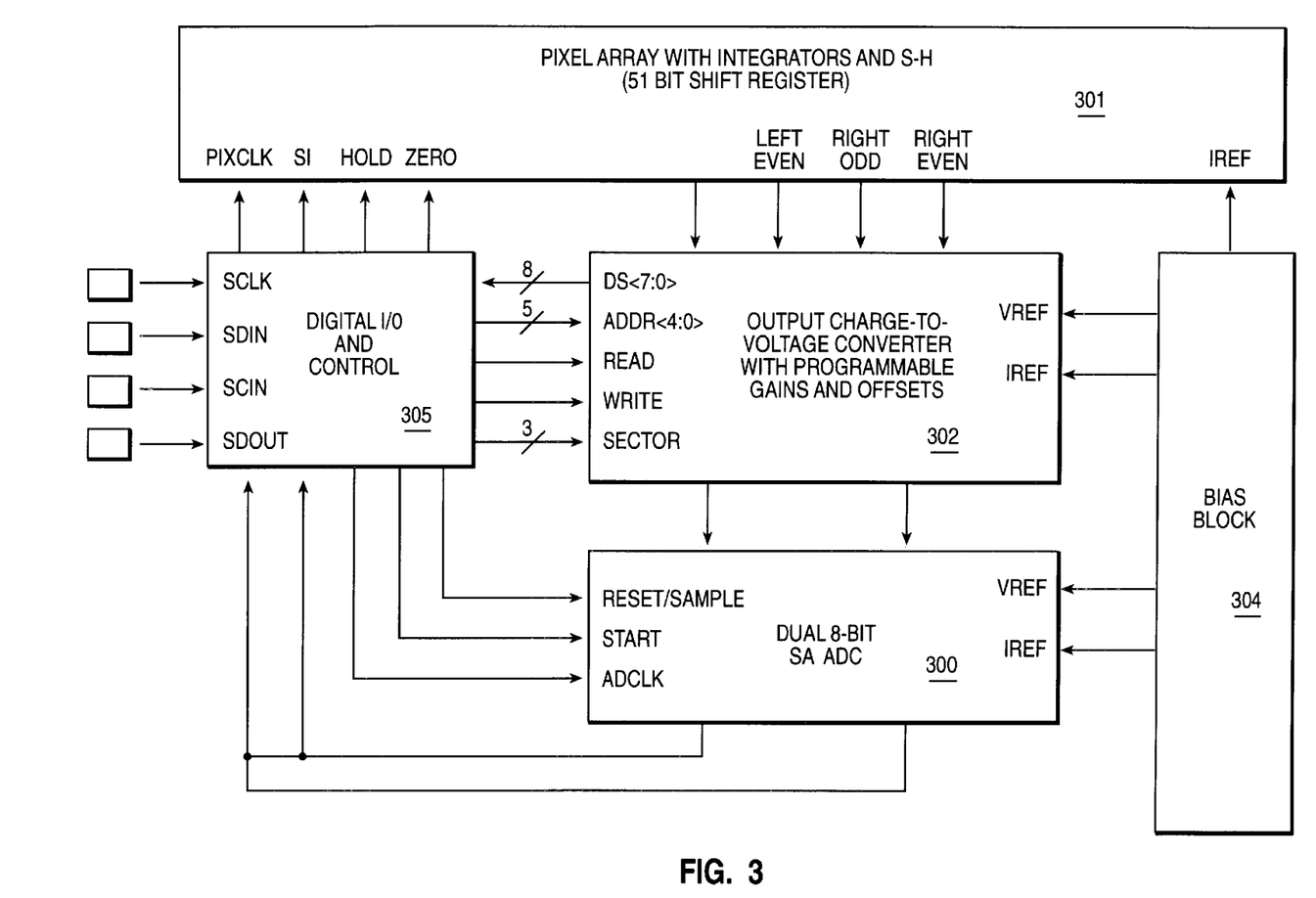
FIG. 3 shows a sample product implementation of the preferred embodiment.

FIG. 3 shows a current product implementation of the preferred embodiment. The innovative control technique has been designed into the TSL2301 Linear Optical Sensor Array manufactured by Texas Instruments. The TSL2301 is a linear (102×1) 300 dpi optical sensor array with an integrated 8-bit ADC 300, and is intended for high performance scanner applications. Light energy impinging on a photodiode of a pixel of the optical array generates photocurrent, which is then integrated by active integration circuitry associated with that pixel. During the integration period, a sampling capacitor connects to the output of the active integrator through an analog switch. A multiplicity of matched capacitors provide voltages which are multi-plexed through the analog switch. The amount of charge accumulated at each pixel is directly proportional to the light intensity on that pixel and to the integration time. Integration, sampling, output, and reset of the integrators are controlled by the control logic 305 in response to commands input via the SDIN connection. Reading the pixels causes the sampled value of each pixel to be converted to an 8-bit digital format and output on the SDOUT pin. The ADC 300 has a high-speed sampling circuit such that the next precharge/evaluation cycle of the charge-coupled amplifier can take place during analog-to-digital conversion. The charge-coupled amplifier located in the charge-to-voltage converter 302 is precharged to the ADC reference so that with no charge input (corresponding to zero voltage on the sampling capacitor being converted), the one's complement output of the converter is zero. The amplifier is also autozeroed during the precharge cycle. The TSL2301 also comprises a 5-bit gain register and an 8-bit offset register. Voltage and current biases are provided to the array 301, the ADC 300, and the charge-to-voltage converter circuitry 302 by a bias circuit 304. Offset correction is performed in the analog domain prior to digital conversion. Offset voltage proportional to the ADC reference is used so that the driving amplifier does not have to drive to zero volts to fully utilize the full input range of the ADC. (Note that this offset has nothing to do with the digital-to-analog converter ("DAC") used to correct for offsets of V1, V2, . . . Vn from the pixel electronics.)

The pixel array 301 is divided into 3 zones of 34 pixels each. There is a separate offset DAC for each of the three zones for correcting dark signal levels. A programmable gain amplifier is used for convenient amplifier control. A separate gain DAC for the programmable gain amplifier is used for each of the three zones. Data communication is accomplished through a three-wire serial interface.

Other features and details which are also contemplated for use in the preferred embodiments, but which are not necessary for practice of the claimed inventions, are disclosed in the following co-pending applications:

Ser. No. 09/333,849 ABN—"Charge-Coupled Amplifier and Converter with Matched Offsets"; and Ser. No. 09/334,205 ABN—"Addressing and Communication for Multiple-Chip Optical Sensor Arrays".

Both of these are commonly owned with the present application, and have effective filing dates which are simultaneous with that of the present application, and are herein incorporated by reference.

Figure 1A:
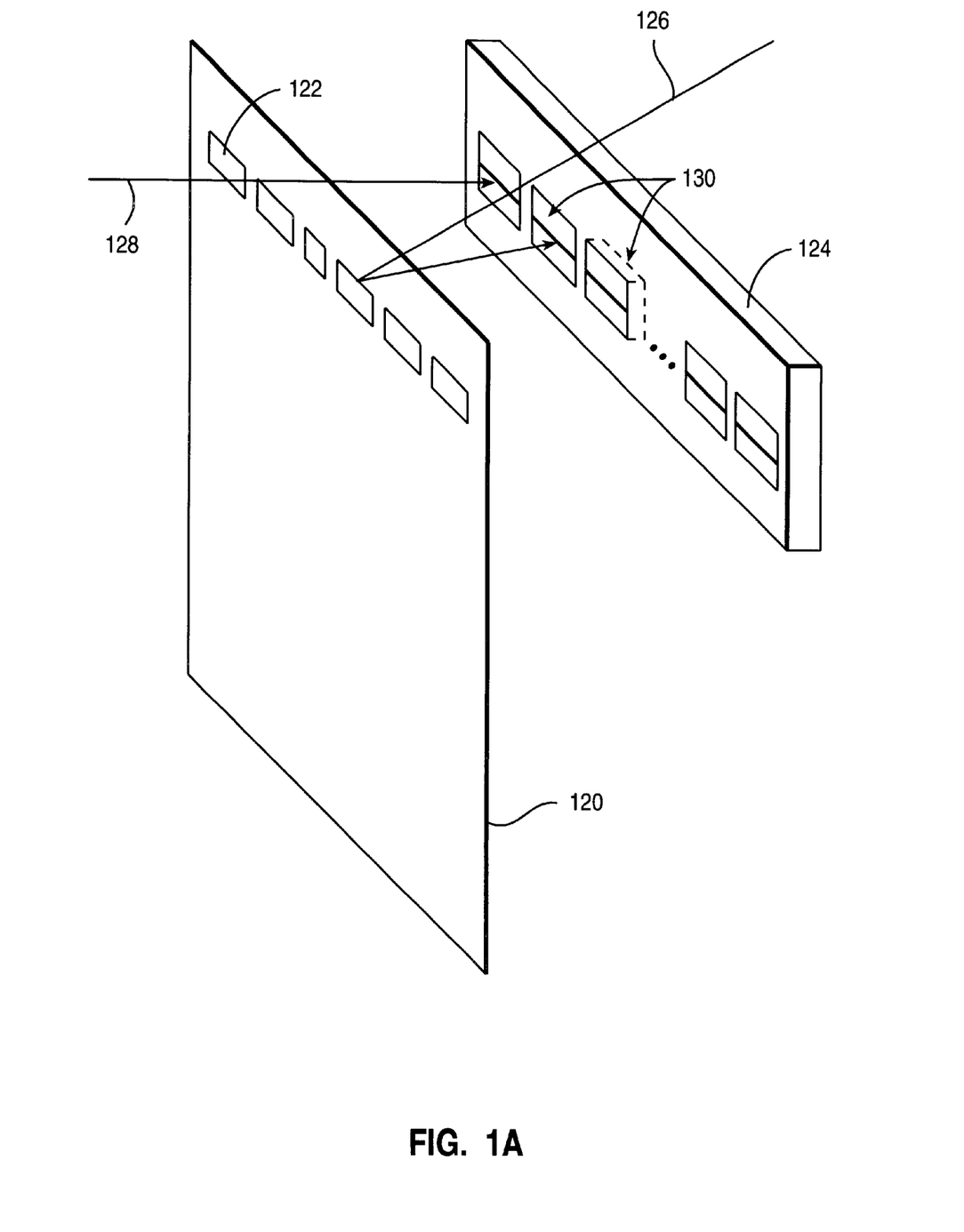
FIG. 1A shows an implementation of the preferred embodiment in a scanner system.

FIG. 1A shows an implementation of the preferred embodiment in a scanner system. A piece of paper 120 containing markings 122 is being scanned by a scanner 124. The scanner 124 may be, for example, be a small scanning system comprising a single chip, a handheld scanner comprising a small number of chips, or even a larger scanner comprising a large number of chips used for larger image scanning jobs. Light energy 128 may be projected through the markings 122 on the paper, or perhaps reflected light 126 may be used to illuminate the markings 122 for detection by the sensors 130 of the scanner 124. In this particular embodiment, the scanner 124 may comprise a number of sensor chips 130 placed linearly in a single row. Other configurations may be employed where several rows of sensor chips 130 may be used to perform the scanning operation.

Figure 1B:
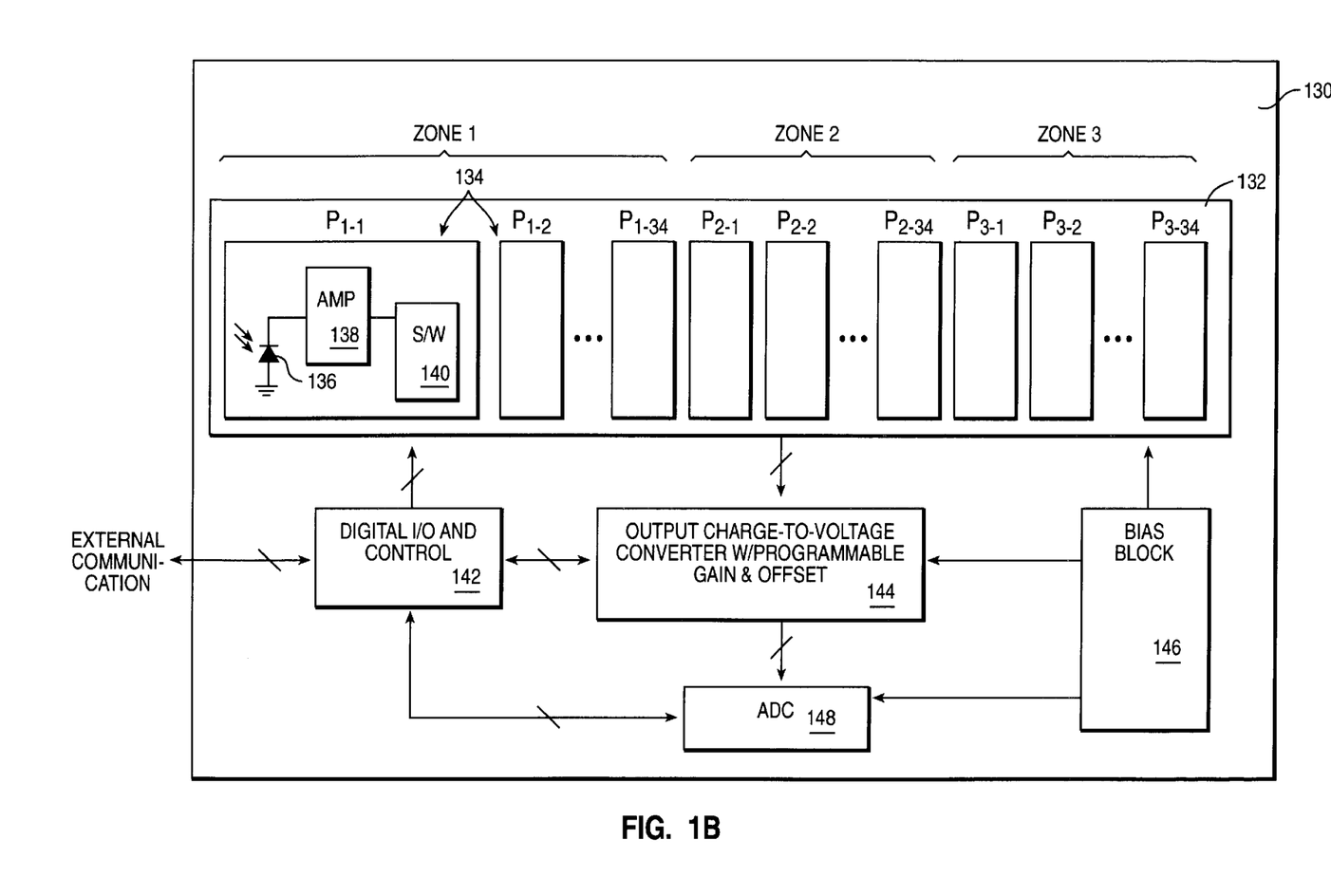
FIG. 1B shows a close-up of a sensor chip used in the scanner of FIG. 1B.

FIG. 1B shows a block diagram of a sensor chip used in the scanner of FIG. 1A. The chip 130 comprises, in this embodiment, a 102×1 linear array 132 of pixels 134 (Px–y, where x=zone, y=pixel of the respective zone). The array 132 is divided into three zones of 34 pixels each. Zone 1 contains 34 pixels designated P1-1 to P1-34, Zone 2 comprises 34 pixels designated P2-1 to P2-34, and Zone 3 comprises 34 pixels designated P3-1 to P3-34. Each pixel 134 comprises a photosensor 136, a charge integrator/amplifier 138, and a sample-hold circuit 140. The chip 130 also includes additional support circuitry for controlling and processing the photo signals. The digital I/O and control circuitry 142 provides a three-wire serial interface to external communications and also control function for all on-board circuits. A charge-to-voltage converter circuit 144 receives the pixel signal and conditions the signal for the ADC 148. It also provides a programmable gain and offset capability for each pixel zone. A bias block 146 provides voltage biasing for the pixel array circuitry 132, the ADC circuitry 148, and the charge-to-converter circuitry 144.

Waveforms at Selected Nodes

Figure 5:
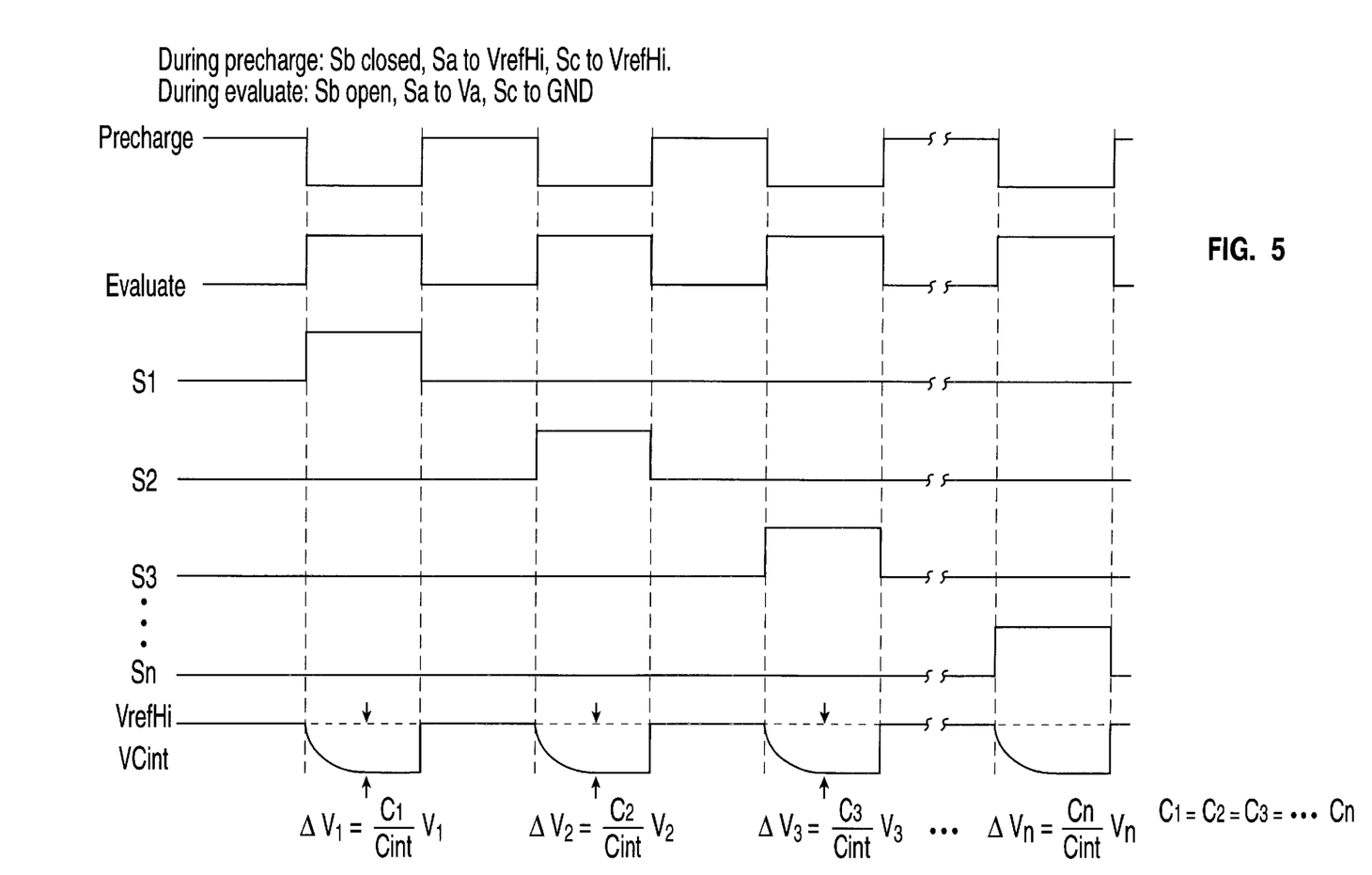
FIG. 5 shows waveforms at selected nodes of the circuit of FIG. 4A.

FIG. 5 shows waveforms at selected nodes of the amplifier. When the precharge phase begins, switch Sb is closed, switch Sa is connected to VrefHi (precharging Cint to VrefHi), and switch Sc also connects to VrefHi (precharging Cos to VrefHi). Switch S1 is connected to the input voltage V1 charging capacitor C1. During the first evaluation phase (for the first charge-coupled circuit with capacitor C1), switch Sb is opened, switch Sa is connected to the ADC input voltage node Va, and switch Sc is connected to ground. Switch S1 is connected to the SUM node and the voltage Va settles to a value which is then digitized. The precharge and evaluation phases continue for all subsequent inputs S2 . . . Sn.

Alternative Embodiment: No Extra Switch and Capacitor

Figure 4B:
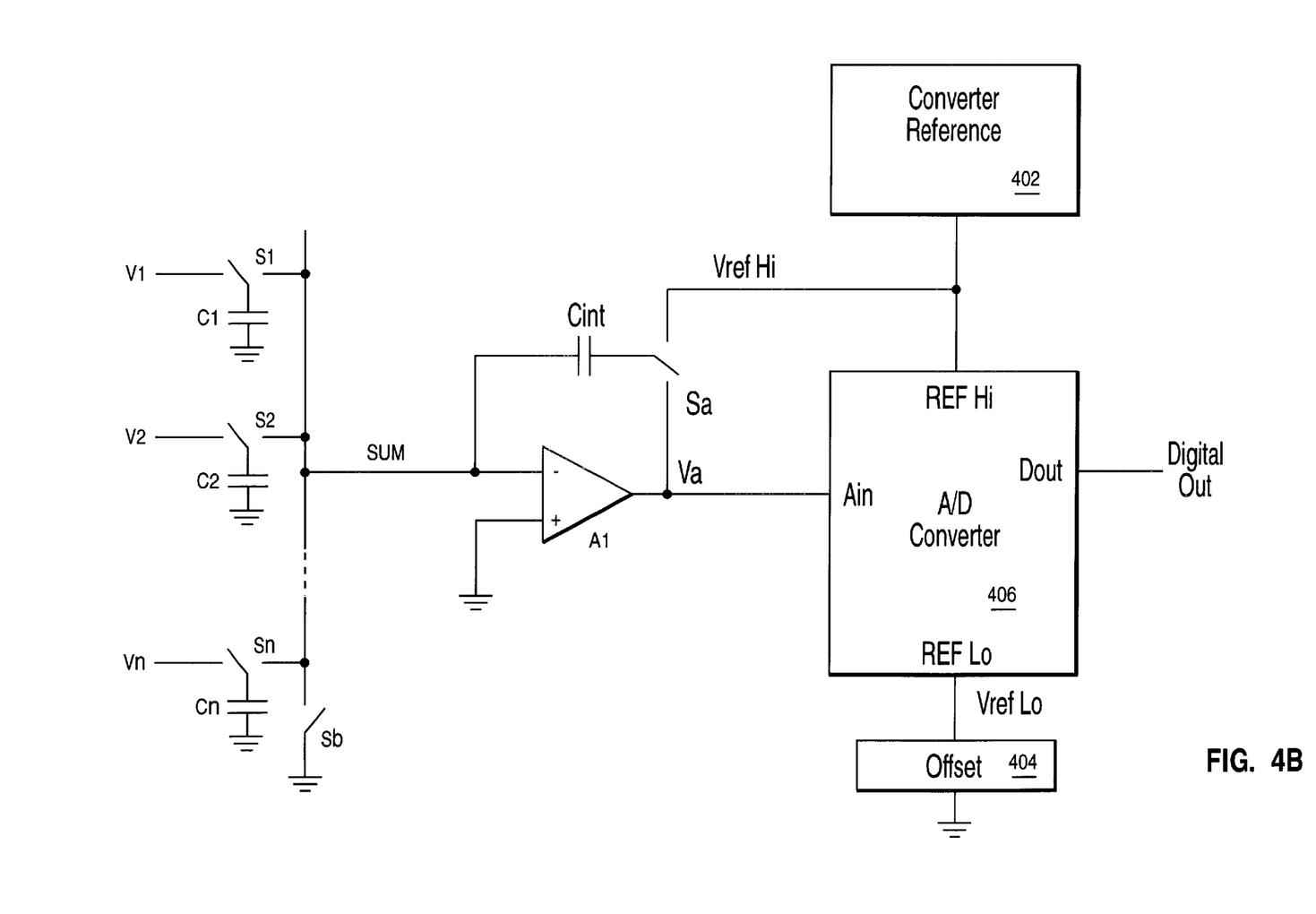
FIG. 4B shows an alternative embodiment.

FIG. 4B shows an alternative embodiment of the circuit of FIG. 4A. In this embodiment, switch Sc and capacitor Cos are not used. To start a conversion cycle, switch Sa is put in the upper position, contact VrefHi, and switch Sb is closed. This precharges capacitor Cint to VrefHi. Next, switch Sb is then opened, switch Sa is switched to the lower position to contact Va, and concurrently switch S1 is connected to the SUM node. Assuming non-overlapping switches, the voltage Va on the output of amplifying element A1 will settle to the voltage Va=VrefHi−(V1*C1)/Cint. Voltage Va is then converted by the ADC, and the digital representation of Va is present at the digital output Dout. Capacitor Cint is a programmable capacitor DAC controlled by the gain and offset registers. Then only the part of the V1 signal due to light response will be inputted into the ADC 406.

Alternative Embodiment: ADC External to the Array Chip

Figure 2:
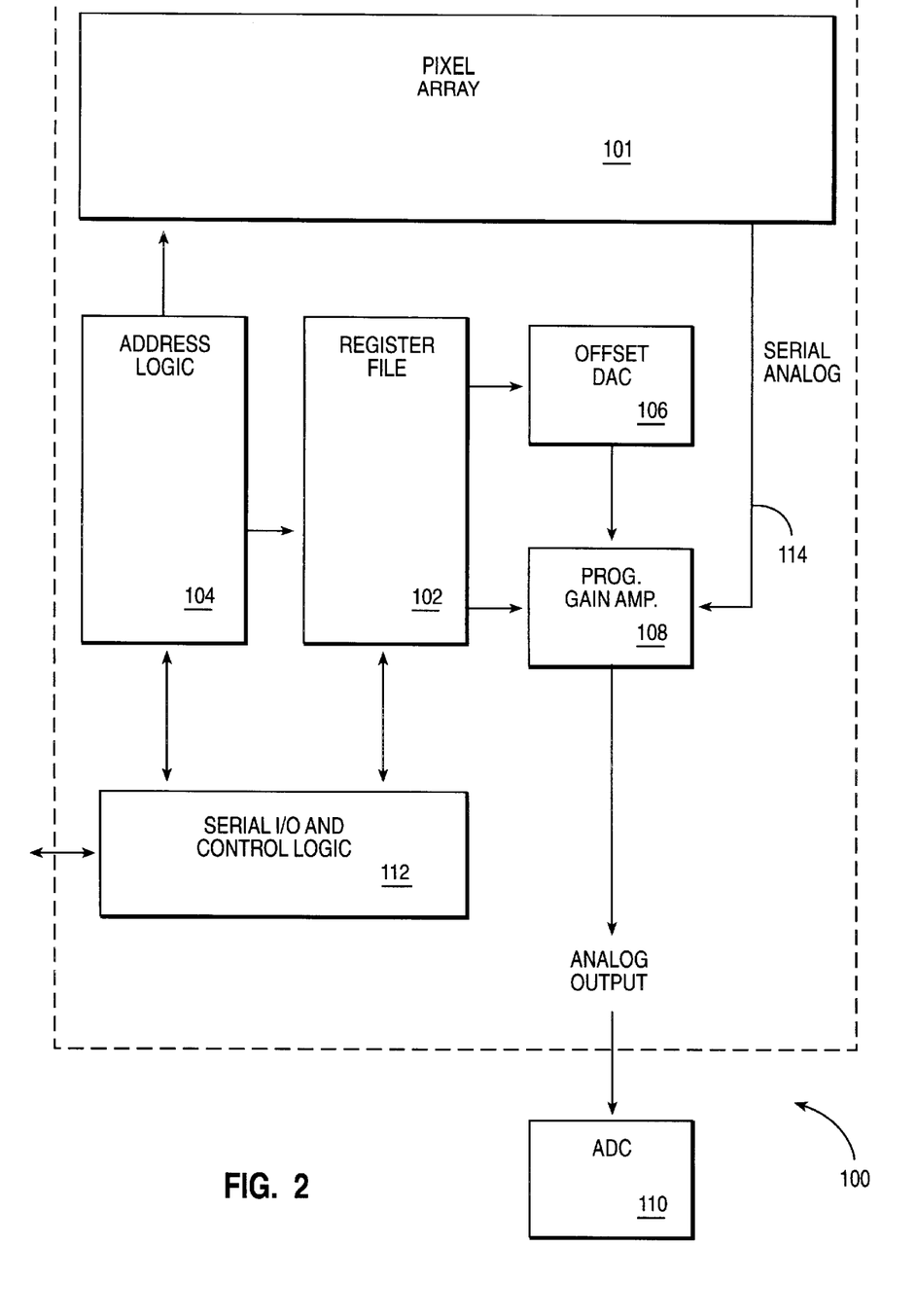
FIG. 2 shows an alternative embodiment where the ADC is located external to the sensor chip.

According to a class of innovative embodiments, FIG. 2 shows a circuit where the ADC 110 may be located external to the sensor chip 100. Therefore, the innovative serial programmability for offset and gain may be used with an array with only an analog output.

Alternative Embodiment: Dynamic Updating

In this class of embodiments the zone-programmable gain and offset parameters are adjusted dynamically, so that the sensing parameters can be optimized with respect to overall scene brightness as the viewed scene changes. This can be done, for example, under control of a microcontroller which periodically monitors such changes and commands appropriate adjustments as needed.

According to a disclosed class of innovative embodiments, there is provided: an optical sensor integrated circuit, comprising: a plurality of pixels in a array, for detecting light energy; wherein said pixels are grouped into zones; and a control circuit for controlling gain and offset of said zones, and communicating with external circuitry; wherein said gain and offset are controlled with respect to said zones before digital conversion.

According to another disclosed class of innovative embodiments, there is provided: an optical sensor integrated circuit, comprising: an array of optical sensors for producing respective outputs which indicate incident illumination at respective pixel locations; and a gain and offset circuit for processing said outputs with gain and offset parameters which are separately optimized for multiple blocks of multiple ones of said pixel locations, but are uniform within each said block.

According to another disclosed class of innovative embodiments, there is provided: an optical sensor integrated circuit, comprising: an array of optical sensors for producing respective outputs which indicate incident illumination at respective pixel locations; and an amplifying and converting circuit for amplifying and converting said analog outputs, using gain and offset parameters which are separately optimized for multiple blocks of multiple ones of said pixel locations, but are uniform within each said block.

According to another disclosed class of innovative embodiments, there is provided: a method for controlling pixel responsivity in an optical sensor integrated circuit, comprising the steps of: (a.) connecting a plurality of pixels in an array for detecting light energy, said pixels being grouped into zones; and (b.) controlling gain and offset of said pixels with a control circuit prior to digital conversion; wherein said control circuit communicates with external circuitry to provide step (b.); wherein said gain and offset are controlled with respect to said zones before digital conversion.

According to another disclosed class of innovative embodiments, there is provided: a method for image sensing, comprising the actions of: (a.) using an array of optical sensors to produce respective outputs which indicate incident illumination at respective pixel locations; and (b.) processing said outputs with gain and offset parameters which are separately optimized for multiple blocks of multiple ones of said pixel locations, but are uniform within each said block.

According to another disclosed class of innovative embodiments, there is provided: a method for image sensing, comprising the actions of: (a.) using an array of optical sensors to produce respective analog outputs which indicate incident illumination at respective pixel locations; and (b.) amplifying and converting said analog outputs, using gain and offset parameters which are separately optimized for multiple blocks of multiple ones of said pixel locations, but are uniform within each said block.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, within the constraints well-known to those of ordinary skill, the disclosed innovative technique may also be used in larger linear arrays of more than 102 pixels.

For another example, within the constraints well-known to those of ordinary skill, the disclosed innovative technique may also be used in arrays with more or less than three zones.

For another example, within the constraints well-known to those of ordinary skill, the disclosed innovative technique is not restricted to for linear arrays, but may also be applied to area arrays.

For another example, within the constraints well-known to those of ordinary skill, the optical chips could be aligned not only in a linear fashion, but also staggered linear (using e.g. three parallel lines of pixels), or could be an area array of any aspect ratio. In such embodiments, the "zone" which is used for adjustment of gain and/or offset may or may not have the same aspect ratio as the array itself.

What is claimed is:

1. An optical sensor integrated circuit, comprising:
   a plurality of pixels in an array, for detecting light energy; wherein said pixels are grouped into zones; and
   a control circuit for controlling gain and offset of said zones, and communicating with external circuitry;
   wherein said gain and offset are separately and simultaneously controlled with respect to said zones before digital conversion.

2. The integrated circuit of claim 1, wherein said pixels are arranged in a substantially linear array.

3. The integrated circuit of claim 1, wherein each said zone of pixels consists of a substantially linear group of adjacent pixels.

4. The integrated circuit of claim 1, wherein said pixels are grouped into only three said zones.

5. An optical sensor integrated circuit, comprising:
   a plurality of pixels in an array, for detecting light energy; wherein said pixels are grouped into zones, and wherein said pixels are CMOS gain cells; and
   a control circuit for controlling gain and offset of said zones, and communicating with external circuitry;
   wherein said gain and offset are controlled with respect to said zones before digital conversion.

6. The integrated circuit of claim 1, wherein at least one said zone includes more than 16 pixels in a line.

7. The integrated circuit of claim 1, wherein an output of said array is a serial analog output which is operatively connected to a programmable gain amplifier.

8. An optical sensor integrated circuit, comprising:
   a plurality of pixels in an array, for detecting light energy; wherein said pixels are grouped into zones, wherein each said zone of pixels has a corresponding pair of registers for controlling said gain and said offset; and
   a control circuit for controlling gain and offset of said zones, and communicating with external circuitry;
   wherein said gain and offset are controlled with respect to said zones before digital conversion.

9. An optical sensor integrated circuit, comprising:
   an array of optical sensors for producing respective outputs which indicate incident illumination at respective pixel locations; and
   a gain and offset circuit for processing said outputs simultaneously with gain and offset parameters which are separately optimized for multiple zones of multiple adjacent ones of said pixel locations, but are uniform within each said zone.

10. The integrated circuit of claim 9, wherein said sensors are arranged in a substantially linear array.

11. The integrated circuit of claim 9, wherein the number of said zones is three.

12. The integrated circuit of claim 9, wherein at least one said zone includes more than 16 pixels in a line.

13. An optical sensor integrated circuit, comprising:
   an array of optical sensors for producing respective outputs which indicate incident illumination at respective pixel locations; and
   a gain and offset circuit for processing said outputs with gain and offset parameters which are separately optimized for multiple zones of multiple adjacent ones of said pixel locations, but are uniform within each said zone, wherein each said zone of pixels has a corresponding pair of registers for controlling said gain and said offset.

14. An optical sensor integrated circuit, comprising:
   an array of optical sensors for producing respective outputs which indicate incident illumination at respective pixel locations; and
   an amplifying and converting circuit for amplifying and converting said analog outputs, simultaneously using gain and offset parameters which are separately optimized for multiple zones of multiple ones of said pixel locations, but are uniform within each said zone.

15. The integrated circuit of claim 14, wherein said sensors are arranged in a substantially linear array.

16. A method for controlling pixel responsivity in an optical sensor integrated circuit, comprising the steps of:
   (a.) connecting a plurality of pixels in an array for detecting light energy, said pixels being grouped into zones; and
   (b.) controlling simultaneously gain and offset of said pixels with a control circuit prior to digital conversion; wherein said control circuit communicates with external circuitry to provide step (b.);
   wherein said gain and offset are controlled with respect to said zones before digital conversion.

17. The method of claim 16, wherein said pixels are arranged in a substantially linear array.

18. The method of claim 16, wherein the number of said zones is only three.

19. The method of claim 16, wherein at least one said zone includes more than 16 pixels in a line.

20. The method of claim 16, wherein both said steps are performed entirely within a single integrated circuit.

21. The method of claim 16, wherein an output of said array is a serial analog output which is operatively connected to a programmable gain amplifier.

22. A method for controlling pixel responsivity in an optical sensor integrated circuit, comprising the steps of:
(a.) connecting a plurality of pixels in an array for detecting light energy, said pixels being grouped into zones; and
(b.) controlling gain and offset of said pixels with a control circuit prior to digital conversion;
wherein said control circuit communicates with external circuitry to provide step (b.);
wherein said gain and offset are controlled with respect to said zones before digital conversion; and
wherein said gain is controlled by a digital word from a register file.

23. A method for controlling pixel responsivity in an optical sensor integrated circuit, comprising the steps of:
(a.) connecting a plurality of pixels in an array for detecting light energy, said pixels being grouped into zones; and
(b.) controlling gain and offset of said pixels with a control circuit prior to digital conversion;
wherein said control circuit communicates with external circuitry to provide step (b.);
wherein said gain and offset are controlled with respect to said zones before digital conversion; and
wherein said offset is controlled by a digital word from a register file.

24. The method of claim 16, wherein the output signal of said optical sensor circuit is analog.

25. A method for image sensing, comprising the actions of:
(a.) using an array of optical sensors to produce respective outputs which indicate incident illumination at respective pixel locations; and
(b.) processing said outputs simultaneously with gain and offset parameters which are separately optimized for multiple zones of multiple ones of said pixel locations, but are uniform within each said zone.

26. The method of claim 25, wherein said sensors are arranged in a substantially linear array.

27. The method of claim 25, wherein both said steps are performed entirely within a single integrated circuit.

28. The method of claim 25, wherein said processing operation includes amplification with a programmable gain, followed by analog-to-digital conversion with a programmable offset.

29. A method for image sensing, comprising the actions of:
(a.) using an array of optical sensors to produce respective analog outputs which indicate incident illumination at respective pixel locations; and
(b.) amplifying and converting said analog outputs, simultaneously using gain and offset parameters which are separately optimized for multiple zones of multiple ones of said pixel locations, but are uniform within each said zone.

30. The method of claim 29, wherein said sensors are arranged in a substantially linear array.

31. The method of claim 29, wherein both said steps are performed entirely within a single integrated circuit.

32. An optical sensor integrated circuit, comprising:
a plurality of pixels in an array, for detecting electromagnetic energy; wherein said pixels are grouped into zones and provide an analog signal output;
a control circuit for controlling gain and offset of pixels in said zones, comprising
a register file including a plurality of pairs of registers, each such pair of registers for storing an offset correction word and a gain correction word, respectively, for an associated zone in said array,
a programmable gain amplifier coupled to the register file and to the array in order to amplify the analog signal in accordance with a gain correction word in the register file to provide an amplified analog signal, and
an offset digital-to-analog converter coupled to the register file and to the programmable gain amplifier so as to control the offset of the amplified analog signal in accordance with an offset correction word in the register file; and
an analog-to-digital converter coupled to receive the amplified analog signal and provide a digital output.

* * * * *